United States Patent
Nagai et al.

(10) Patent No.: US 6,716,655 B2
(45) Date of Patent: Apr. 6, 2004

(54) GROUP III NITRIDE COMPOUND SEMICONDUCTOR ELEMENT AND METHOD FOR PRODUCING THE SAME

(75) Inventors: Seiji Nagai, Aichi (JP); Masayoshi Koike, Aichi (JP); Kazuyoshi Tomita, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/160,288

(22) Filed: Jun. 4, 2002

(65) Prior Publication Data

US 2002/0197841 A1 Dec. 26, 2002

(30) Foreign Application Priority Data

Jun. 5, 2001 (JP) .................................. 2001-168936

(51) Int. Cl.$^7$ ............................................. H01L 33/04
(52) U.S. Cl. ........................... 438/22; 438/24; 438/36; 438/37; 438/46; 438/47
(58) Field of Search ..................... 267/79–103

(56) References Cited

U.S. PATENT DOCUMENTS 6,015,979 A * 1/2000 Sugiura et al. ............... 257/86
6,045,626 A * 4/2000 Yano et al. ................. 148/33.4

FOREIGN PATENT DOCUMENTS

| JP | H11-340576 | 12/1999 |
| JP | 2000-114663 | 4/2000 |
| JP | 2000-332289 | 11/2000 |
| JP | 2000-332294 | 11/2000 |
| JP | 2000-349336 | 12/2000 |

* cited by examiner

Primary Examiner—Long Pham
Assistant Examiner—Wai-Sing Louie
(74) Attorney, Agent, or Firm—McGinn & Gibb, PLLC

(57) ABSTRACT

An object of the invention is to produce, at high efficiency, semiconductor elements which are formed of a high-quality crystalline semiconductor having no cracks and a low dislocation density and which have excellent characteristics. Specifically, a mask formed from $SiO_2$ film is provided on the Si(111) plane of an n-type silicon substrate, and a window portion (crystal growth region) in the shape of an equilateral triangle having a side of approximately 300 $\mu$m is formed through the mask. The three sides of the equilateral triangle are composed of three edges; each edge defined by the (111) plane and another crystal plane that is cleavable. Subsequently, a multi-layer structure of semiconductor crystals in an LED is formed through crystal growth of a Group III nitride compound semiconductor. Thus, limiting the area of one crystal growth region to a considerably small area weakens a stress applied to a semiconductor layer, thereby readily producing semiconductor elements having excellent crystallinity. In addition, semiconductor elements can be arranged in a semiconductor wafer at high packing density without loss, and each side of these semiconductor elements can be readily arranged in a line on a semiconductor wafer, thereby enhancing quality, yield, productivity, etc. of semiconductor elements.

8 Claims, 5 Drawing Sheets

GROUP III NITRIDE COMPOUND SEMICONDUCTOR ELEMENT AND METHOD FOR PRODUCING THE SAME

This is a patent application based on a Japanese patent application No. 2001-168936 which was filed on Jun. 5, 2001 and which is incorporated herein by reference.

BACKGROUND OF THE INVENTION

1. Field of the Invention

The present invention relates to a Group III nitride compound semiconductor element which is produced through steps including a step of growing semiconductor crystals and a separation step for producing chips of the produced semiconductor wafer (semiconductor elements), and to a method for producing the Group III nitride compound semiconductor.

2. Background Art

As shown in FIG. 5 and as is widely known, when a Group III nitride compound semiconductor such as gallium nitride (GaN) grown on the Si(111) plane—serving as a crystal growth plane (crystal growth region)—of a silicon substrate is cooled to ambient temperature, a number of dislocations and cracks are generated in the grown semiconductor layer.

When a number of dislocations and cracks are generated in the grown layer (nitride semiconductor layer), a number of lattice defects, dislocations, deformation, cracks, etc., are generated in a device fabricated from the semiconductor layer, thereby deteriorating device characteristics.

In the case in which hexagonal GaN crystals are grown on a silicon substrate having a so-called diamond structure, the Si(111) plane—closest packing plane—is typically employed as a crystal growth plane. In the process in which a customary semiconductor element having a rectangular plane shape is formed through crystal growth on the Si(111) plane and a plurality of individual semiconductor elements (chips) are separated from the semiconductor wafer, at least two sidewalls of the semiconductor element are composed of two cleavable cutting planes. Thus, a scribing step becomes cumbersome or difficult, thereby prolonging a production time or tending to provide defective products having deteriorated device characteristics caused by cracks, etc. As a result, productivity cannot be enhanced.

In addition, when a customary semiconductor element of a rectangular shape is formed on the Si(111) plane, an allowance region for scribing in the aforementioned scribing step occupies a considerably large area of the semiconductor wafer, thereby failing to enhance semiconductor wafer utilization efficiency (yield).

SUMMARY OF THE INVENTION

The present invention has been accomplished in order to overcome the aforementioned drawbacks. Thus, an object of the present invention is to produce, at high efficiency, semiconductor elements which are formed of a high-quality crystalline semiconductor having low dislocation density and no cracks and which have excellent characteristics.

According to first means to overcome the above-described drawbacks, the present invention provides a method for producing a semiconductor element comprising growing a crystalline semiconductor A formed of a Group III nitride compound semiconductor on a crystal growth region provided on the Si(111) plane of a silicon substrate, the crystal growth region being limited in terms of its area by means of masking or a similar technique, wherein the entirety or a portion of the periphery of the crystal growth region generally coincides with an edge defined by the Si(111) plane and another crystal plane that is cleavable.

The semiconductor layer composed of the aforementioned crystalline semiconductor A may have a single-layer structure or a multi-layer structure.

As used herein, the term "Group III nitride compound semiconductor" generally refers to a 2-component, 3-component, or 4-component semiconductor having arbitrary compound crystal proportions and represented by $Al_xGa_yIn_{(1-x-y)}N$ ($0 \leq x \leq 1$; $0 \leq y \leq 1$; $0 \leq x+y \leq 1$). The "Group III nitride compound semiconductor" of the present invention also encompasses such species containing a p-type or n-type dopant.

In the present specification, the "Group III nitride compound semiconductor" also encompasses semiconductors in which the aforementioned Group III elements (Al, Ga, In) are partially substituted by boron (B), thallium (Tl), etc. or in which nitrogen (N) atoms are partially substituted by phosphorus (P), arsenic (As), antimony (Sb), bismuth (Bi), etc.

Examples of the p-type dopant which can be added include magnesium (Mg) and calcium (Ca).

Examples of the n-type dopant which can be added include silicon (Si), sulfur (S), selenium (Se), tellurium (Te), and germanium (Ge).

These dopants may be used in combination of two or more species, and a p-type dopant and an n-type dopant may be added simultaneously.

As described above, when the entire periphery of the crystal growth region is composed of edges each defined by two planes; i.e., the Si(111) plane and another crystal plane that is cleavable (or in other words, crystal plane of cleavage fracture), the entire sidewall of the silicon substrate belonging to each semiconductor element is exclusively composed of a cleavable silicon crystal plane. Thus, the scribing step is remarkably simplified, thereby shortening the production time, and defective products having deteriorated device characteristics caused by cracks, etc. can be decreased, leading to remarkable enhancement in productivity. In addition, cutting allowance required for scribing can be reduced considerably, leading to remarkable improvement of yield.

When an Si(1-10) crystal plane is employed as a cleavable crystal plane, the Si(1-10) crystal plane and a GaN(11-20) plane coincide, thereby reducing the amount of material rise at a peripheral portion of the crystal growth region. Thus, the crystal growth plane of the wafer can be further flattened, thereby increasing the yield of flat portions.

In contrast to the case in which a customary rectangular (generally rectangle) growth region is provided, according to the present invention, the growth rate is substantially uniform over the entire peripheral portion of the crystal growth region, since all edges surrounding the crystal growth region are composed of equivalent planes; i.e., [1-10]. Thus, the thickness of the growth layer at the peripheral portion of the crystal growth region becomes substantially uniform, and therefore, the width of the emission wavelength (half-value (emission intensity) width of the emission wavelength) decreases, to thereby enable production of a light-emitting element having an emission wavelength with small variation and an intense emission peak.

In the aforementioned first aspect, the crystalline semiconductor A is preferably formed of a Group III nitride compound semiconductor represented by $Al_xGa_yIn_{(1-x-y)}N$ ($0 \leq x \leq 1$; $0 \leq y \leq 1$; $0 \leq x+y \leq 1$).

In the aforementioned first aspect, the crystal plane that is cleavable is preferably selected from a (-101) plane, a (1-10) plane, and a (01-1) plane of the aforementioned silicon substrate.

For example, as shown in FIG. 1, these three planes are selected in order to provide equilateral triangular crystal growth regions. The combination of these cleavable crystal planes is arbitrary. For example, as shown in FIG. 2, when equilateral triangular crystal growth regions are provided, those arranged in opposite orientations (i.e., those whose orientations differ by 180°) can be provided.

By employing such cleavable crystal planes serving as sidewalls of a semiconductor element, a scribing step can be simplified.

However, the sides of the periphery of one light-emitting element are not necessarily provided simultaneously from all the three planes. When at least one side of the periphery of the light-emitting element is composed of the aforementioned edge, the aforementioned advantages are attained to at least some extent. For example, a light-emitting element may have a right triangle plane shape having a top angle of approximately 60°, and two sides forming the angle may be composed of the aforementioned edge. Through employment of such a plane shape, the aforementioned advantages are also attained to an extent similar to or greater than that attained above.

In the first aspect, the aforementioned crystal growth region preferably has a shape or an approximate shape of an equilateral triangle, parallelogram, isosceles trapezoid, or equiangular hexagon. The shape or approximate shape may be a pentagon having only one acute-angled (60°) apex, and the aforementioned equiangular hexagon may be equilateral or scalene.

Particularly, when equilateral triangle arrangement or parallelogram arrangement of crystal growth regions is employed, planes of semiconductor elements can be arranged in a semiconductor wafer at high packing density without loss. In addition, each side of these semiconductor elements can be readily arranged in a line on the wafer, thereby remarkably facilitating scribing. Thus, quality and productivity of semiconductor elements can be further enhanced.

In the first aspect, preferably, a single element of the semiconductor element is formed on a single region of the crystal growth region. In other words, the dimensions and shape of the crystal growth region are caused to generally coincide with those of the semiconductor element.

As described above, limiting the area of one crystal growth region to a small area limits or suppresses cracks generated due to a stress attributed to differences in lattice constant and thermal expansion coefficient and exerted between a silicon substrate and a semiconductor layer (crystalline semiconductor A). Thus, semiconductor elements having excellent crystallinity can be readily produced.

Despite employment of a thick silicon substrate, in which relaxation of stress generated in a semiconductor element is difficult, application of a stress to a semiconductor layer (crystalline semiconductor A) is mitigated by limiting the area of one crystal growth region to a very small area. Thus, a thin-film silicon substrate, which readily relaxes the stress applied to a semiconductor layer and tends to break, does not have to be employed as a crystal growth substrate (Si substrate), thereby attaining easy handling of silicon substrates and leading to enhancement of productivity and quality.

In second aspect, there is provided a Group III nitride compound semiconductor element produced through employment of the structure based on the aforementioned first aspect.

The second aspect is drawn to the structure or configuration of the semiconductor element per se. Specifically, there is provided a Group III nitride compound semiconductor element produced by growing crystalline semiconductor A formed of a Group III nitride compound semiconductor on a crystal growth region provided on the Si(111) plane of a silicon substrate, the crystal growth region being limited in terms of its area by aspect of masking or a similar technique, wherein the entirety or a portion of the periphery of the crystal growth region generally coincides with an edge defined by the Si(111) plane and another crystal plane that is cleavable.

In addition to the above second aspect, at least one of the below-described preferred element structure is employed.

Specifically, the aforementioned crystalline semiconductor A is formed of a Group III nitride compound semiconductor represented by $Al_xGa_yIn_{(1-x-y)}N$ ($0 \leq x \leq 1$; $0 \leq y \leq 1$; $0 \leq x+y \leq 1$).

The aforementioned crystal plane that is cleavable is selected from a (-101) plane, a (1-10) plane, and a (01-1) plane of the aforementioned silicon substrate.

The periphery of the aforementioned crystal growth region has a shape or an approximate shape of an equilateral triangle, parallelogram, isosceles trapezoid, or equiangular hexagon.

One semiconductor element is formed on one crystal growth region. In other words, the dimensions and shape of the crystal growth region are caused to generally coincide with those of the semiconductor element.

Through employment of the aforementioned aspect of the present invention, the aforementioned drawbacks can be overcome effectively and rationally.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
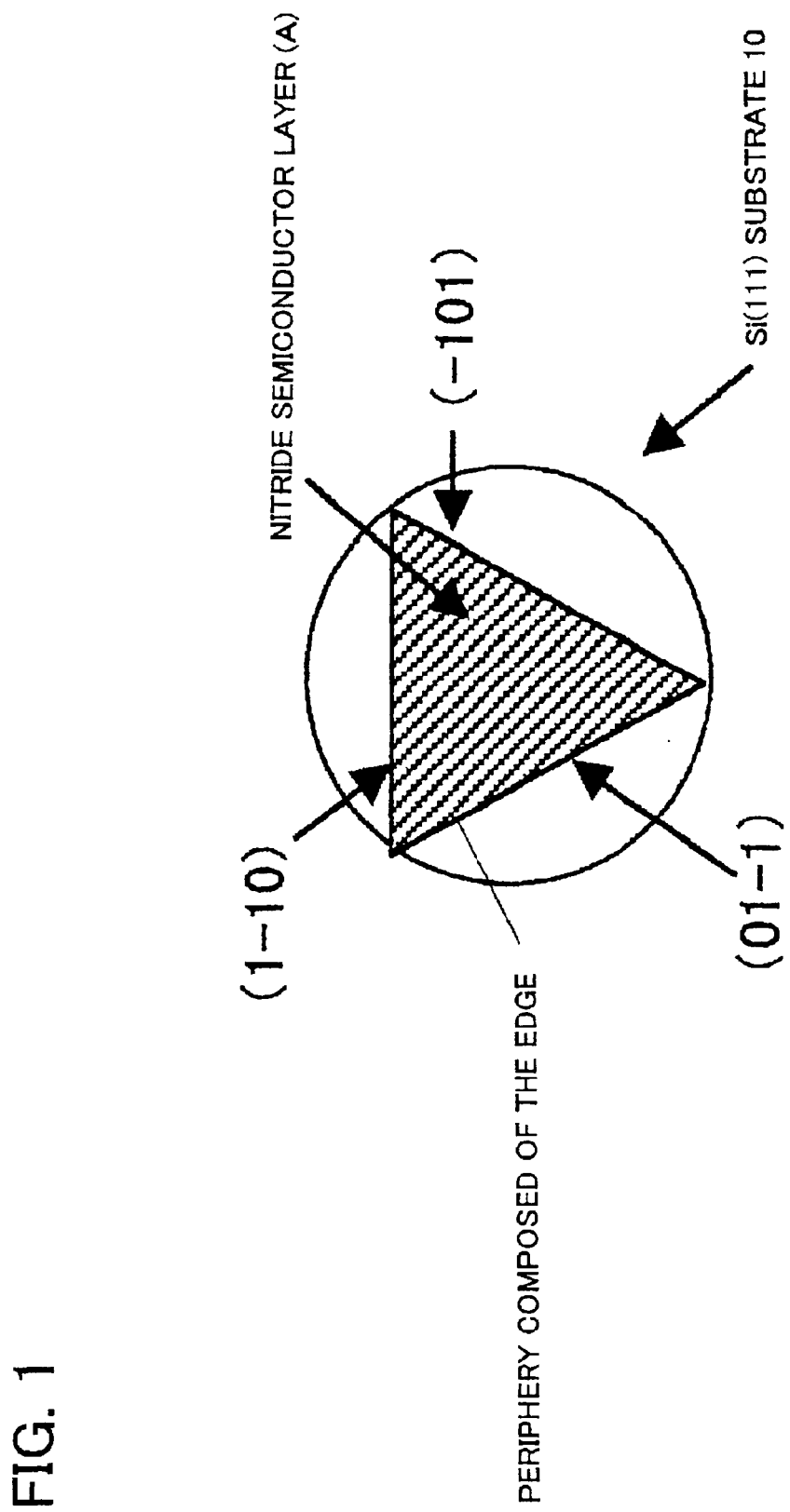
FIG. 1 is a schematic plane view showing a crystal growth region of the present invention, the region being isolated along its periphery by a mask.

For carrying out the present invention, any of the following production conditions may be selected. These production conditions may also be arbitrarily combined.

Firstly, Group III nitride compound semiconductor layers are preferably formed through metal-organic vapor phase growth (MOCVD or MOVPE). Other growth methods, such as molecular-beam epitaxy (MBE), halide vapor phase growth (halide VPE), and liquid phase growth (LPE), may also be employed. Moreover, the respective layers may be formed through different methods.

Preferably, a buffer layer is appropriately formed on the surface of a silicon substrate or provided in the crystalline semiconductor A, for several reasons, such as correction of lattice mismatch.

Particularly, when the buffer layer (intermediate layer) is provided in the crystalline semiconductor A, the buffer layer is preferably formed from a Group III nitride compound semiconductor $Al_xGa_yIn_{1-x-y}N$ ($0 \leq x \leq 1$; $0 \leq y \leq 1$; $0 \leq x+y \leq 1$) which is formed at low temperature, more preferably $Al_xGa_{1-x}N$ ($0 \leq x \leq 1$). The buffer layer may be a single layer or a multi-layer comprising a plurality of sub layers of different compositions. The buffer layer may be formed at a low temperature (380–420° C.), or may be formed at 1,000–1,180° C. through MOCVD. Alternatively, a buffer layer comprising AlN may be formed through reactive sputtering by use of a DC magnetron sputtering apparatus, from high-purity metallic aluminum and nitrogen gas serving as raw materials.

The buffer layer comprising a compound semiconductor represented by formula $Al_xGa_yIn_{1-x-y}N$ ($0 \leq x \leq 1$; $0 \leq y \leq 1$; $0 \leq x+y \leq 1$; arbitrary compositional proportions) can be formed through physical vapor deposition such as vapor deposition, ion plating, laser ablation, or ECR. The buffer layer is preferably formed through physical vapor deposition at 200–600° C., more preferably 300–600° C., most preferably 350–450° C. The buffer layer which is formed through physical vapor deposition such as sputtering preferably has a thickness of 100–3,000 Å, more preferably 100–400 Å, most preferably 100–300 Å.

A buffer layer of multi-layer type is formed through any of several methods. For example, an $Al_xGa_{1-x}N$ ($0 \leq x \leq 1$) layer and a GaN layer are alternately formed, or a semiconductor layer of the same composition is alternately formed at different temperatures, such as 600° C. or lower and 1000° C. or higher. These two methods may be employed in combination. The multi-layer buffer layer may be formed by stacking at least three species selected from Group III nitride compound semiconductors represented by $Al_xGa_yIn_{1-x-y}N$ ($0 \leq x \leq 1$; $0 \leq y \leq 1$; $0 \leq x+y \leq 1$).

In the buffer layer and the upper Group III nitride compound semiconductor layer, Group III elements may be partially substituted by boron (B) or thallium (Tl), and nitrogen (N) atoms may be partially substituted by phosphorus (P), arsenic (As), antimony (Sb), or bismuth (Bi). These substituted species are also applicable in practice in the present invention. In addition, these semiconductors may be doped in a small amount which is negligible in the composition thereof. Specifically, $Al_xGa_{1-x}N$ ($0 \leq x \leq 1$)—a Group III nitride compound semiconductor containing no indium (In) or arsenic (As)—may be doped with indium (In), which has an atomic radius greater than that of aluminum (Al) or gallium (Ga), or with arsenic (As), which has an atomic radius greater than that of nitrogen (N), thereby providing compressive strain for compensating expansion strain of crystals due to loss of nitrogen atoms, thereby leading to enhancement of crystallinity.

By enhancing crystallinity in the aforementioned manner, the present invention can further reduce the occurrence of penetrating dislocation to a level of approximately 1/100 to 1/1000. When a base layer is formed of at least two stacking sets of a buffer layer and a Group III nitride compound semiconductor layer, doping with an element having an atomic radius greater than that of predominant constitutional elements of each Group III nitride compound semiconductor layer is particularly preferred. When a light-emitting element is fabricated from a Group III nitride compound semiconductor, 2-component or 3-component species thereof are preferably employed.

When an n-type Group III nitride compound semiconductor layer is formed, Group IV elements such as Si, Ge, Se, Te, and C or Group VI elements may be added as n-type dopants. Group II elements such as Zn, Mg, Be, Ca, Sr, and Ba or Group IV elements may be added as p-type dopants. These dopants may be added in combination, and an n-type dopant and a p-type dopant may be doped simultaneously in one layer.

EXAMPLES

The present invention will next be described in more detail by way of examples, which should not be construed as limiting the invention thereto.

In the following Example, a method of producing an LED chip (semiconductor element) comprising the below-described three steps, (1) to (3), will be described.
<1> Masking Step In the masking step, a mask is formed on a silicon substrate in order to limit crystal growth regions.

<a> $SiO_2$ film is formed on the Si(111) plane of an n-type silicon substrate through sputtering.

Figure 2:
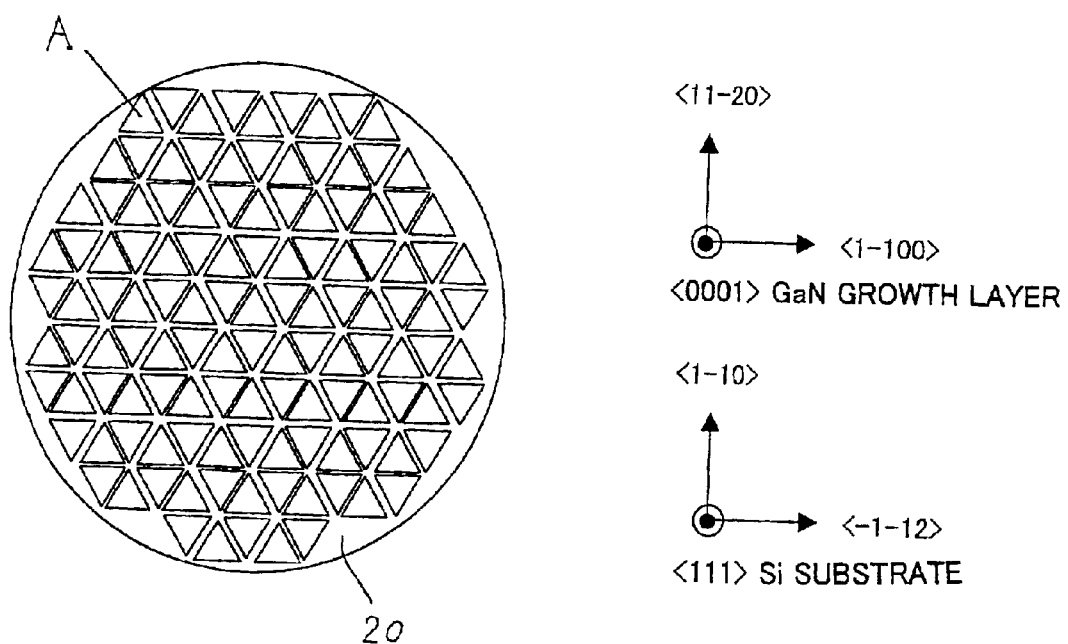
FIG. 2 is a schematic plane view of a nitride semiconductor wafer 100 according to an embodiment of the present invention.
Figure 3:
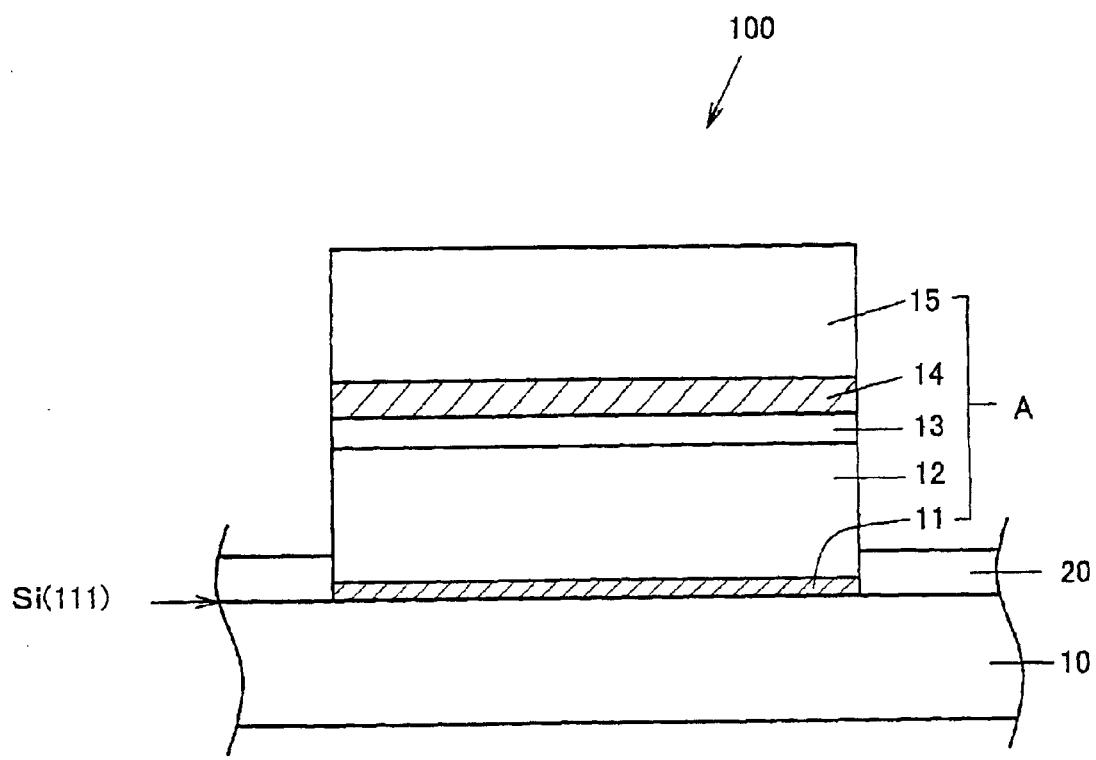
FIG. 3 is a schematic cross-sectional view of a nitride semiconductor wafer 100 according to the embodiment.

<b> Subsequently, as shown in FIGS. 2 and 3, a window portion (crystal growth region) in the shape of an equilateral triangle having a side of approximately 300 μm is formed. Specifically, the $SiO_2$ film is subjected to photolithography and wet-etching such that the three sides of the equilateral triangle are composed of three edges; i.e., an edge defined by the (111) plane and the (01-1) plane; an edge defined by the (111) plane and the (1-10) plane; and an edge defined by the (111) plane and the (-101) plane.

For example, the acceptable distance between the window portions; i.e., the shortest distance from one window portion to an adjacent window portion, is approximately 50 μm.
<2> Stacking Step In the stacking step, a multi-layer structure of semiconductor crystals in the LED is formed through crystal growth of a Group III nitride compound semiconductor.

<a> On the exposed surface (crystal growth regions) of a silicon substrate 10 having the aforementioned mask (reference numeral 20 in FIGS. 2 and 3), an n-type buffer layer 11 is formed from Si-doped AlGaN. A film thickness of 300 nm and a crystal growth temperature of 1,100° C. may be employed.

<b> Subsequently, an n-type semiconductor layer 12 having a thickness of approximately 1.5 μm is formed from Si-doped GaN. A crystal growth temperature of 1,100° C. may be employed.

<c> On the n-type semiconductor layer 12 are sequentially stacked an n-type semiconductor layer 13 having a thickness of 0.02 μm and formed of Si-doped AlGaN; a layer 14 which contains a light-emitting layer, has a thickness of 50 nm, and is formed of non-doped InGaN; and a p-type semiconductor layer 15 having a thickness of 0.1 μm and formed of Mg-doped GaN. A crystal growth temperature of 1,100° C. may be employed.

<d> The thus-processed semiconductor wafer is cooled to ambient temperature. The cooling rate is preferably 20° C./min or less.
(3) Chip-formation Step In the chip-formation step, electrodes are formed on the aforementioned semiconductor wafer 100 (FIG. 3), and the wafer is separated into individual semiconductor elements (LED chips).

<a> A positive electrode is formed on each p-type semiconductor layer 15 through vapor deposition.

<b> A negative electrode is formed on the back side (a plane on which no crystals are grown) of the Si substrate through vapor deposition.

<c> Then, the aforementioned $SiO_2$ mask 20 is scribed by use of a diamond scriber.

<d> Finally, the entire surface of the semiconductor wafer 100 is pressurized appropriately, thereby separating the wafer 100 into individual semiconductor elements (LED chips).

As described above, when the entire periphery of each crystal growth region is composed of three edges each defined by two planes; i.e., the Si(111) plane and another crystal plane that is cleavable, the entire sidewall of the silicon substrate belonging to each semiconductor element is exclusively composed of a cleavable silicon crystal plane. Thus, the scribing step is remarkably simplified, thereby shortening the production time, and defective products having deteriorated device characteristics caused by cracks, etc. can be decreased, thereby leading to remarkable enhancement in productivity. In addition, cutting allowance required for scribing can be reduced considerably, resulting in remarkable improvement of yield.

Figure 4:
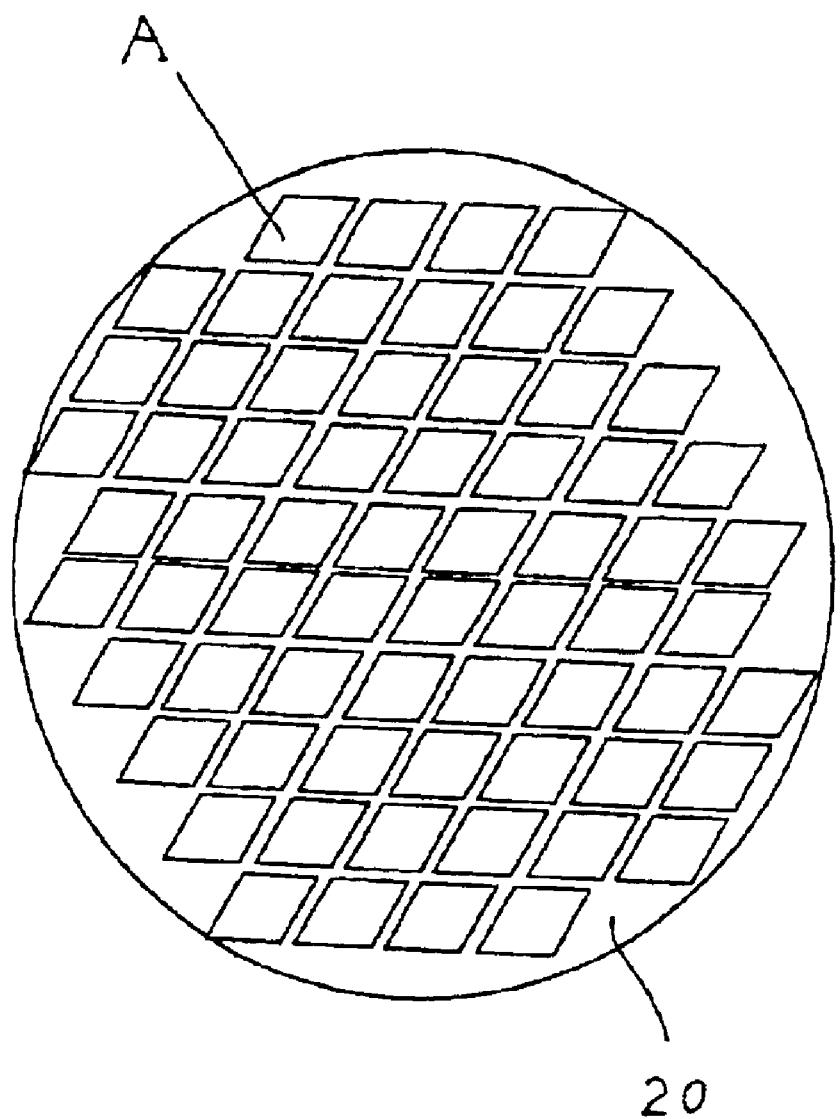
FIG. 4 is a schematic plane view of a nitride semiconductor wafer according to another embodiment of the present invention.
Figure 5:
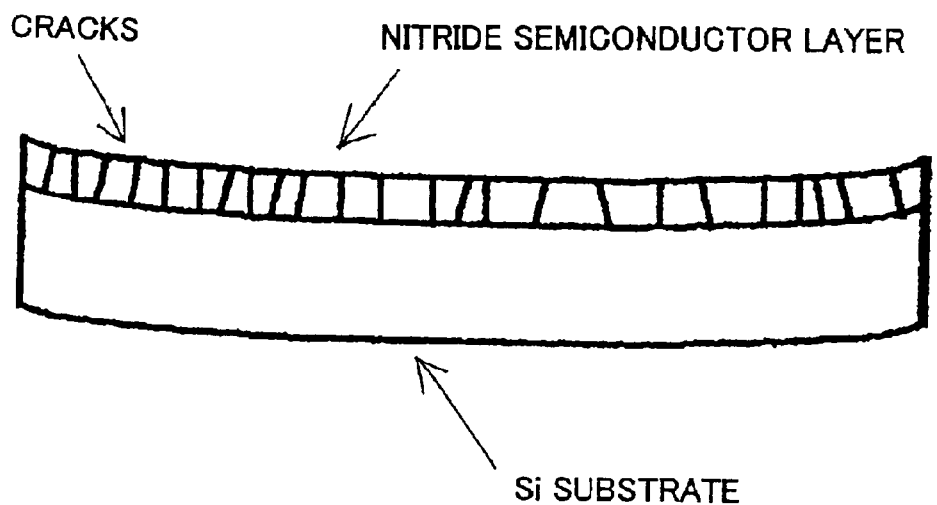
FIG. 5 is a schematic cross-sectional view of a conventional nitride semiconductor wafer.

In the above Example, the plane arrangement of each semiconductor element, as shown in FIG. 2, is provided as an equilateral triangle pattern. However, rather than the equilateral triangle pattern shown in FIG. 2, a plane arrangement of a parallelogram pattern, as shown in FIG. 4, may be employed in the same plane as is shown in FIG. 2. This plane arrangement also attains generally equivalent effects. Moreover, the plane shape of each element is not limited to a equilateral triangle pattern or a parallelogram pattern.

The crystal growth of the present invention can be performed through any known crystal growth methods such as metal-organic vapor phase growth (MOVPE) and halide vapor phase growth (HVPE).

A semiconductor element such as an FET or a light-emitting element can be fabricated from the Group III nitride compound semiconductor. Possible stacking structures of the light-emitting element include a multiple quantum well structure (MQW), a single quantum well structure (SQW), a homo-junction structure, a hetero-junction structure, and a double-hetero-junction structure. Alternatively, the stacking structure may be formed by means of a pin junction, a pn junction, etc.

Dislocations occurring in a Group III nitride compound semiconductor layer can also be reduced through employment of lateral epitaxial growth. In this case, lateral epitaxial growth can be performed in an arbitrary manner; e.g., by use of a mask or through employment of etching for leveling a step and supplying the step as seed for executing ELO between steps.

The aforementioned mask 20 or the aforementioned etching mask may be formed from a polycrystalline semiconductor such as polycrystalline silicon or polycrystalline nitride semiconductor; an oxide or nitride such as silicon oxide ($SiO_x$), silicon nitride ($SiN_x$), titanium oxide ($TiO_x$), or zirconium oxide ($ZrO_x$); or a high-melting-point metal such as titanium (Ti) or tungsten (W). A multi-layer film of these materials may also be employed. The film can be formed through any film formation method such as vapor phase growth (e.g., vapor deposition, sputtering, or CVD).

Although reactive ion beam etching (RIBE) is a preferred etching method, any other etching method can also be employed. A step having a lateral cross-section which is not normal to the substrate plane may be formed. For example, a step whose bottom is not in contact with the bottom of the substrate and which has a V-shape cross-section may be formed through anisotropic etching.

Obviously, numerous modifications and variations of the present invention are possible in light of the above teachings. It is therefore to be understood that within the scope of the appended claims, the present invention may be practiced otherwise than as specifically described herein.

What is claimed is:

1. A method for producing a Group III nitride compound semiconductor element comprising:

growing a crystalline semiconductor A formed of a Group III nitride compound semiconductor on a crystal growth region provided on the Si(111) plane of a silicon substrate, the crystal growth region being limited in terms of its area by masking or a similar technique, wherein an entirety or a portion of a periphery of the crystal growth region generally coincides with an edge defined by the Si(111) plane and another crystal plane that is cleavable, and wherein the crystal plane that is cleavable comprises one of a (-101) plane, a (1-10) plane, and a (01-1) plane of the silicon substrate.

2. A method for producing a Group III nitride compound semiconductor element comprising:

growing a crystalline semiconductor A formed of a Group III nitride compound semiconductor on a crystal growth region provided on the Si(111) plane of a silicon substrate, the crystal growth region being limited in terms of its area by masking or a similar technique, wherein an entirety or a portion of a periphery of the crystal growth region generally coincides with an edge defined by the Si(111) plane and another crystal plane that is cleavable, wherein the crystalline semiconductor A comprises a Group III nitride compound semiconductor represented by $Al_xGa_yIn_{(1-x-y)}N$ ($0 \leq x \leq 1$; $0 \leq y \leq 1$; $0 \leq x+y \leq 1$), and wherein the crystal plane that is cleavable comprises one of a (-101) plane, a (1-10) plane, and a (01-1) plane of the silicon substrate.

3. A method for producing a Group III nitride compound semiconductor element according to claim 1, wherein the crystal growth region has a shape or an approximate shape of an equilateral triangle, a parallelogram, an isosceles trapezoid, or an equiangular hexagon.

4. A method for producing a Group III nitride compound semiconductor element according to claim 2, wherein the crystal growth region has a shape or an approximate shape of an equilateral triangle, a parallelogram, an isosceles trapezoid, or an equiangular hexagon.

5. A method for producing a Group III nitride compound semiconductor element according to claim 1, wherein a single element of the semiconductor element is formed on a single region of the crystal growth region.

6. A Group III nitride compound semiconductor light-emitting element which is produced through a method for producing a Group III nitride compound semiconductor element as recited in claim 1.

7. A method for producing a Group III nitride compound semiconductor element according to claim 1, further comprising forming a mask for limiting said crystal growth region.

8. A method for producing a Group III nitride compound semiconductor element according to claim 7, further comprising stacking said crystalline semiconductor, forming electrodes and separating said crystal growth region into individual semiconductor elements.

* * * * *